US012809243B2

(12) United States Patent
Chien et al.

(10) Patent No.: US 12,809,243 B2
(45) Date of Patent: Nov. 24, 2026

(54) HEAT DISSIPATION MODULE AND PROJECTION APPARATUS

(71) Applicant: Coretronic Corporation, Hsin-Chu (TW)

(72) Inventors: Wei-Min Chien, Hsin-Chu (TW); Tung-Chou Hu, Hsin-Chu (TW); Yao-Hung Chen, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 239 days.

(21) Appl. No.: 18/895,331

(22) Filed: Sep. 24, 2024

(65) Prior Publication Data

US 2025/0110395 A1 Apr. 3, 2025

(30) Foreign Application Priority Data

Sep. 28, 2023 (CN) ......................... 202311268201.5
Jan. 18, 2024 (CN) ......................... 202410073122.7

(51) Int. Cl.
*G03B 21/16* (2006.01)
*G03B 21/14* (2006.01)
(Continued)

(52) U.S. Cl.
CPC ........... *G03B 21/16* (2013.01); *G03B 21/145* (2013.01); *G03B 21/2053* (2013.01);
(Continued)

(58) Field of Classification Search
CPC .................. G03B 21/16; G03B 21/145; G03B 21/2053; G03B 21/206; H05K 7/20172; H05K 7/20418
(Continued)

(56) References Cited

U.S. PATENT DOCUMENTS

2020/0041883 A1* 2/2020 Chung ................ G03B 21/208
2020/0041884 A1 2/2020 Chung et al.
(Continued)

FOREIGN PATENT DOCUMENTS

CN 101196770 6/2008
CN 101365319 2/2009
(Continued)

OTHER PUBLICATIONS

"Office Action of China Counterpart Application", issued on Aug. 23, 2025, p. 1-p. 11.
"Notice of Allowance of China Counterpart Application," issued on Mar. 30, 2026, p. 1-p. 5, in which the listed reference was/references were cited.

*Primary Examiner* — Magda Cruz
(74) *Attorney, Agent, or Firm* — JCIPRNET

(57) ABSTRACT

A heat dissipation module includes an airflow generator, a heat dissipation substrate connected to a heat source, a heat dissipation member, a baffle, and a heat conductive member connected to the heat dissipation substrate. The heat dissipation member includes a main body and first fins arranged around an outer periphery of the main body and forming an accommodation space with the main body. The airflow generator has a rotation axis, and is accommodated in the accommodation space and connected to the main body. The baffle is connected to the first fins and has an opening corresponded to an air inlet surface of the airflow generator. On a reference plane perpendicular to the rotation axis, at least a part of an orthographic projection of each first fin does not overlap an orthographic projection of the airflow generator, and an orthographic projection of the baffle overlaps the orthographic projections of the first fins.

28 Claims, 16 Drawing Sheets

(51) Int. Cl.
*G03B 21/20* (2006.01)
*H05K 7/20* (2006.01)

(52) U.S. Cl.
CPC ....... *G03B 21/206* (2013.01); *H05K 7/20172* (2013.01); *H05K 7/20418* (2013.01)

(58) Field of Classification Search
USPC ............................................................ 353/57
See application file for complete search history.

(56) References Cited

U.S. PATENT DOCUMENTS

| | | | | |
|---|---|---|---|---|
| 2023/0020100 A1* | 1/2023 | Wu | .................... | H05K 7/20136 |
| 2023/0132215 A1* | 4/2023 | Kuo | ....................... | G03B 21/16 353/57 |

FOREIGN PATENT DOCUMENTS

| | | | | |
|---|---|---|---|---|
| CN | 201540442 | | 8/2010 | |
| CN | 201556020 | | 8/2010 | |
| CN | 102083292 | | 6/2011 | |
| CN | 102083292 | A * | 6/2011 | .............. F21V 29/67 |
| CN | 102647880 | | 8/2012 | |
| CN | 109219309 | | 1/2019 | |
| CN | 111290203 | | 4/2022 | |
| CN | 114563902 | | 5/2022 | |
| CN | 218644531 | | 3/2023 | |
| TW | M317041 | | 8/2007 | |
| TW | M560038 | | 5/2018 | |
| TW | 201826005 | | 7/2018 | |
| WO | 2008044717 | | 4/2008 | |

* cited by examiner

HEAT DISSIPATION MODULE AND PROJECTION APPARATUS

CROSS-REFERENCE TO RELATED APPLICATION

This application claims the priority benefits of China application serial no. 202311268201.5, filed on Sep. 28, 2023, and China application serial no. 202410073122.7, filed on Jan. 18, 2024. The entirety of the above-mentioned patent applications is hereby incorporated by reference herein and made a part of this specification.

BACKGROUND

Technical Field

The disclosure relates to a heat dissipation module, and particularly relates to a projection apparatus using the heat dissipation module.

Description of Related Art

With the advancement of technology, the sizes of projection apparatuses are being reduced, and portable projection apparatuses have also been developed. However, due to different appearance designs of the projection apparatuses, it is necessary to consider whether the heat dissipation modules in the projection apparatuses can transfer heat properly and whether the heat dissipation modules cause noise.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the disclosure was acknowledged by a person of ordinary skill in the art.

SUMMARY

The disclosure provides a heat dissipation module that achieves favorable heat dissipation effects and generates less noise.

The disclosure provides a projection apparatus that includes the heat dissipation module.

Other objectives and advantages of the disclosure can be understood from the technical features described in the disclosure.

In order to achieve one, part or all of the above objectives or other objectives, an embodiment of the disclosure provides a heat dissipation module adapted for dissipating heat from a heat source. The heat dissipation module includes an airflow generator, a heat dissipation substrate, a heat dissipation member, a baffle, and a heat conductive member (conductive objects with thermal conductivity are not limited to materials, shapes and structures, such as metal solid structures, heat pipes that is metal hollow structures with working fluid inside.) The heat dissipation substrate is connected to the heat source. The heat conductive member is connected between the heat dissipation substrate and the heat dissipation member to transfer thermal energy of the heat source from the heat dissipation substrate to the heat dissipation member. The heat dissipation member includes a main body and a plurality of first fins. The plurality of first fins are arranged around an outer periphery of the main body. The plurality of first fins and the main body form an accommodation space. The airflow generator has a rotation axis, and is accommodated in the accommodation space and connected to the main body. The baffle is connected to the plurality of first fins and has an opening corresponded to an air inlet surface of the airflow generator. The opening is located on the rotation axis, and on a reference plane perpendicular to the rotation axis, at least a part of an orthographic projection of each of the plurality of first fins does not overlap an orthographic projection of the airflow generator, and an orthographic projection of the baffle overlaps the orthographic projections of the plurality of first fins.

In order to achieve one, part or all of the above objectives or other objectives, an embodiment of the disclosure provides a projection apparatus, which includes a housing, a light source module, an optomechanical module, a projection lens, and the heat dissipation module described above. The heat dissipation module, the light source module, the optomechanical module, and the projection lens are arranged in the housing. The housing includes a first cover plate, a second cover plate opposite to the first cover plate, and a cylindrical portion connected between the first cover plate and the second cover plate. The cylindrical portion has an air inlet adjacent to the first cover plate and an air outlet adjacent to the second cover plate. The light source module is configured to provide an illumination beam. The optomechanical module is arranged on a transmission path of the illumination beam. The optomechanical module includes a light valve configured to convert the illumination beam into an image beam. The projection lens is located on a transmission path of the image beam from the light valve, and is configured to project the image beam out of the projection apparatus.

Based on the above, the embodiments of the disclosure have at least one of the following advantages or effects. In the projection apparatus according to the disclosure, the heat dissipation module is adapted for dissipating heat from the heat source. For example, the ambient air outside the housing of the projection apparatus is allowed to flow into the housing through the air inlet, enter the air inlet surface of the airflow generator from the opening of the baffle, then enter the airflow channels of the heat dissipation member from the airflow generator, and flow out of the housing from the air outlet, thereby achieving favorable heat dissipation effects.

In order to make the above-mentioned features and advantages of the disclosure easier to understand, exemplary embodiments will be described in detail below with reference to the accompanying drawings.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DETAILED DESCRIPTION OF DISCLOSED EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
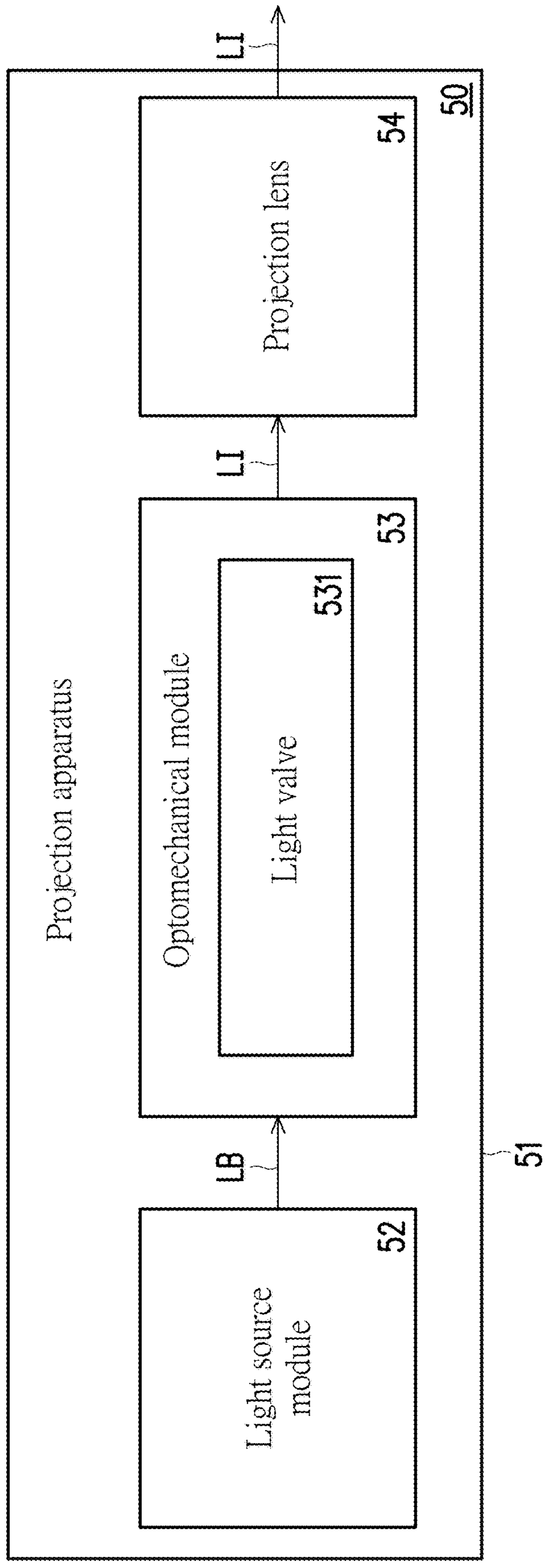
FIG. 1 is a schematic diagram of a projection apparatus according to an embodiment of the disclosure.
Figure 2A:
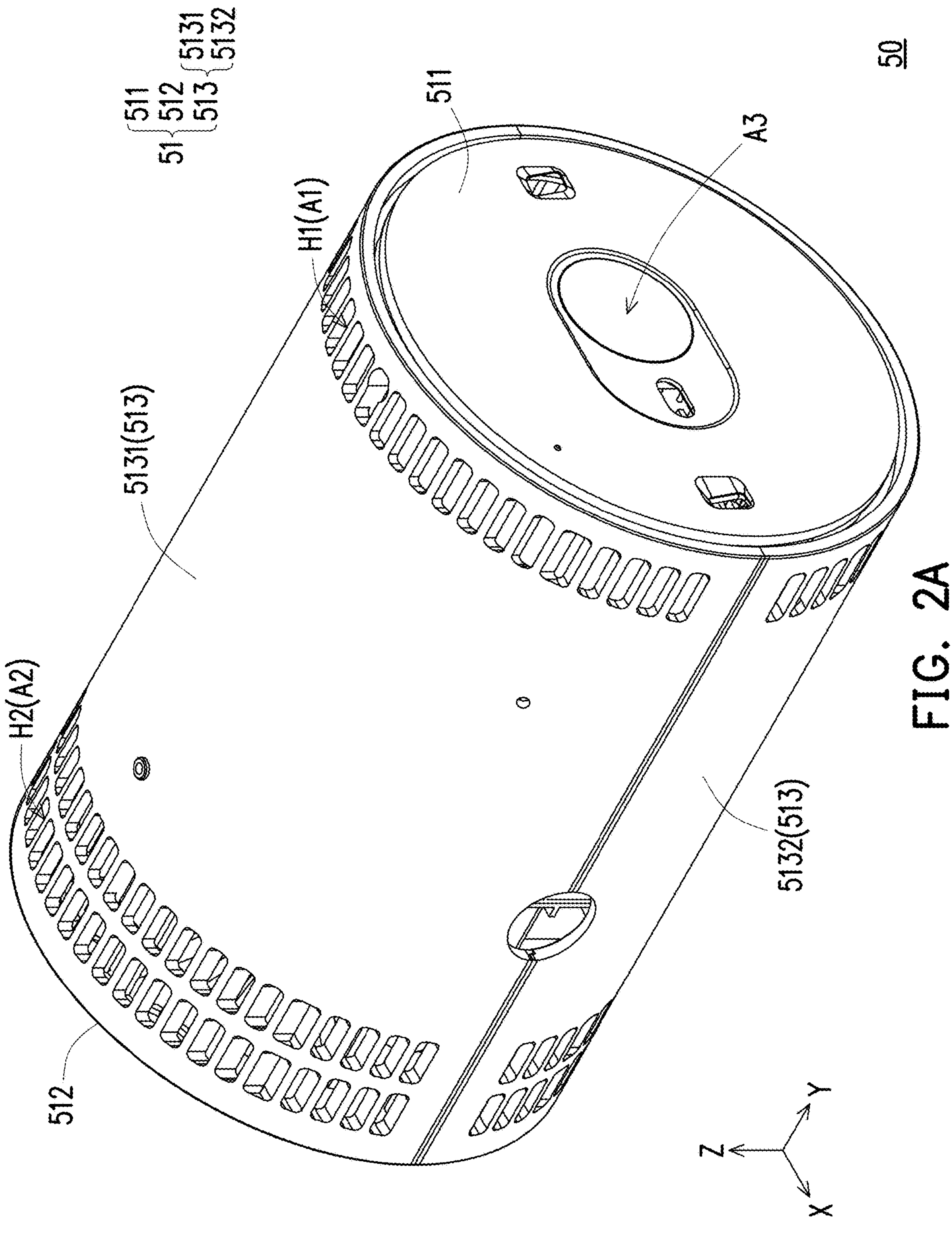
FIG. 2A is a schematic perspective view of the projection apparatus of FIG. 1.
Figure 2B:
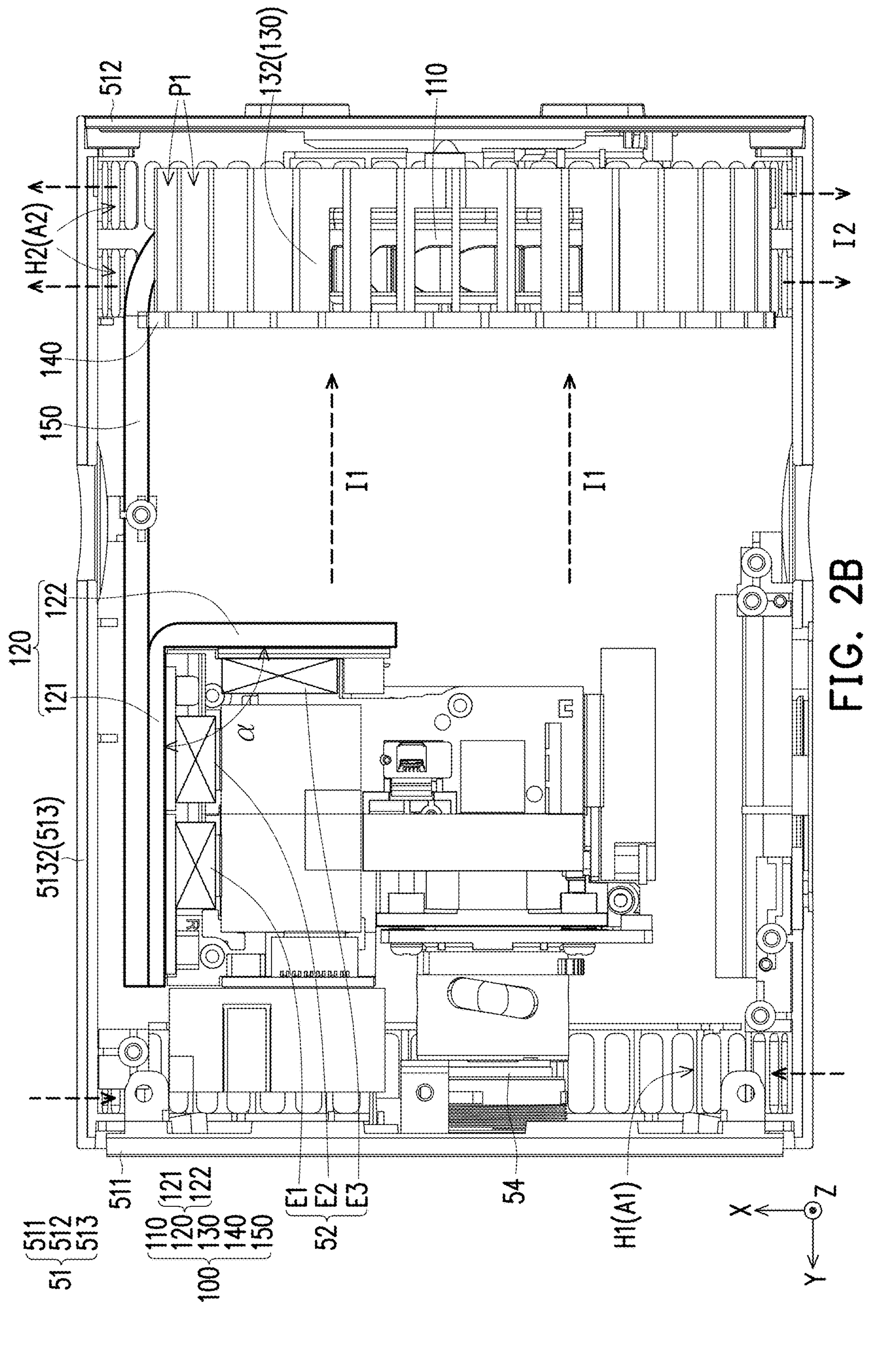
FIG. 2B is a schematic top view of the projection apparatus of FIG. 1.

FIG. 1 is a schematic diagram of a projection apparatus according to an embodiment of the disclosure. FIG. 2A is a schematic perspective view of the projection apparatus of FIG. 1. FIG. 2B is a schematic top view of the projection apparatus of FIG. 1. It should be noted that an X direction, a Y direction, and a Z direction are marked in FIG. 2A and FIG. 2B to show the configuration relationship between the components in the drawings. The X direction, the Y direction, and the Z direction are perpendicular to each other, but not limited thereto. Some irrelevant structures may be omitted from FIG. 1 to FIG. 2B to facilitate display and identification of the components to be explained.

Referring to FIG. 1 to FIG. 2B, the projection apparatus (projector) 50 of this embodiment includes a housing 51, a light source module 52, an optomechanical module 53, and a projection lens 54. The light source module 52 is configured to provide an illumination beam LB. The optomechanical module 53 is arranged on the transmission path of the illumination beam LB. The optomechanical module 53 includes a light valve 531. The light valve 531 is configured to convert the illumination beam LB into an image beam LI. The projection lens 54 is located on the transmission path of the image beam LI from the light valve 531, and is configured to project the image beam LI out of the projection apparatus 50 to a projection target (not shown) such as a screen or a wall.

The light valve 531 is, for example, a reflective light modulator such as a liquid crystal on silicon panel (LCoS panel) and a digital micro-mirror device (DMD). In some embodiments, the light valve 531 may be a transmissive light modulator such as a transparent liquid crystal panel, an electro-optical modulator, a magneto-optic modulator, and an acousto-optic modulator (AOM). The disclosure is not intended to limit the light valve 531 to a certain form or type. Regarding detailed steps and implementation of the method for the light valve 531 to convert the illumination beam LB into the image beam LI, sufficient teaching, suggestion, and description may be obtained from the common knowledge in the field and therefore will not be repeated here. In different embodiments, the number of light valves 531 may be one to three, but the disclosure is not limited thereto.

The projection lens 54 includes, for example, a combination of one or more optical lenses with refractive power, for example, various combinations of non-planar lenses such as biconcave lenses, biconvex lenses, concave-convex lenses, convex-concave lenses, plano-convex lenses, and plano-concave lenses. In some embodiments, the projection lens 54 may also include a planar optical lens to project the image beam LI from the light valve 531 to the projection target. The disclosure is not intended to limit the projection lens 54 to a certain form or type.

Specifically, the housing 51 has a first cover plate 511, a second cover plate 512 opposite to the first cover plate 511, and a cylindrical portion 513 connected between the first cover plate 511 and the second cover plate 512. The first cover plate 511 is provided with a light outlet A3, and the image beam LI from the projection lens 54 is projected outside the projection apparatus 50 from the light outlet A3 of the first cover plate 511.

The light source module 52, the optomechanical module 53, and at least part of the projection lens 54 are arranged in the housing 51. In this embodiment, the projection lens 54 is entirely arranged inside the housing 51. The cylindrical portion 513 has a cylindrical appearance and is formed by assembling a first shell 5131 and a second shell 5132. For example, the two shells together form a hollow cylinder. In other embodiments, a hollow cylinder may also be formed by a single shell. The cylindrical portion 513 has an air inlet A1 adjacent to the first cover plate 511, and the cylindrical portion 513 has an air outlet A2 adjacent to the second cover plate 512. The air inlet A1 includes a plurality of first openings H1 surrounding the first cover plate 511, and the air outlet A2 includes a plurality of second openings H2 surrounding the second cover plate 512, allowing ambient air to flow in through the plurality of first openings H1 of the air inlet A1 and flow out through the plurality of second openings H2 of the air outlet A2.

In this embodiment, the projection apparatus 50 further includes a heat dissipation module 100 arranged in the housing 51. The heat dissipation module 100 is adapted for dissipating heat from a heat source. The heat source includes, for example, light-emitting elements E1, E2, and E3 of the light source module 52, and each of the light-emitting elements E1, E2, and E3 is, for example, at least one light-emitting diode or at least one laser diode configured to provide a beam of at least one color, but the disclosure is not limited thereto. In other embodiments, the light source module 52 is configured with only one light-emitting element. The heat source may also be the light valve 531 of the optomechanical module 53.

Generally speaking, micro projectors are limited in choice of fans. Due to the fan frame, only smaller fans can be used for the same diameter, which increases the noise. The projection apparatus according to the disclosure solves the above problem.

Figure 3A:
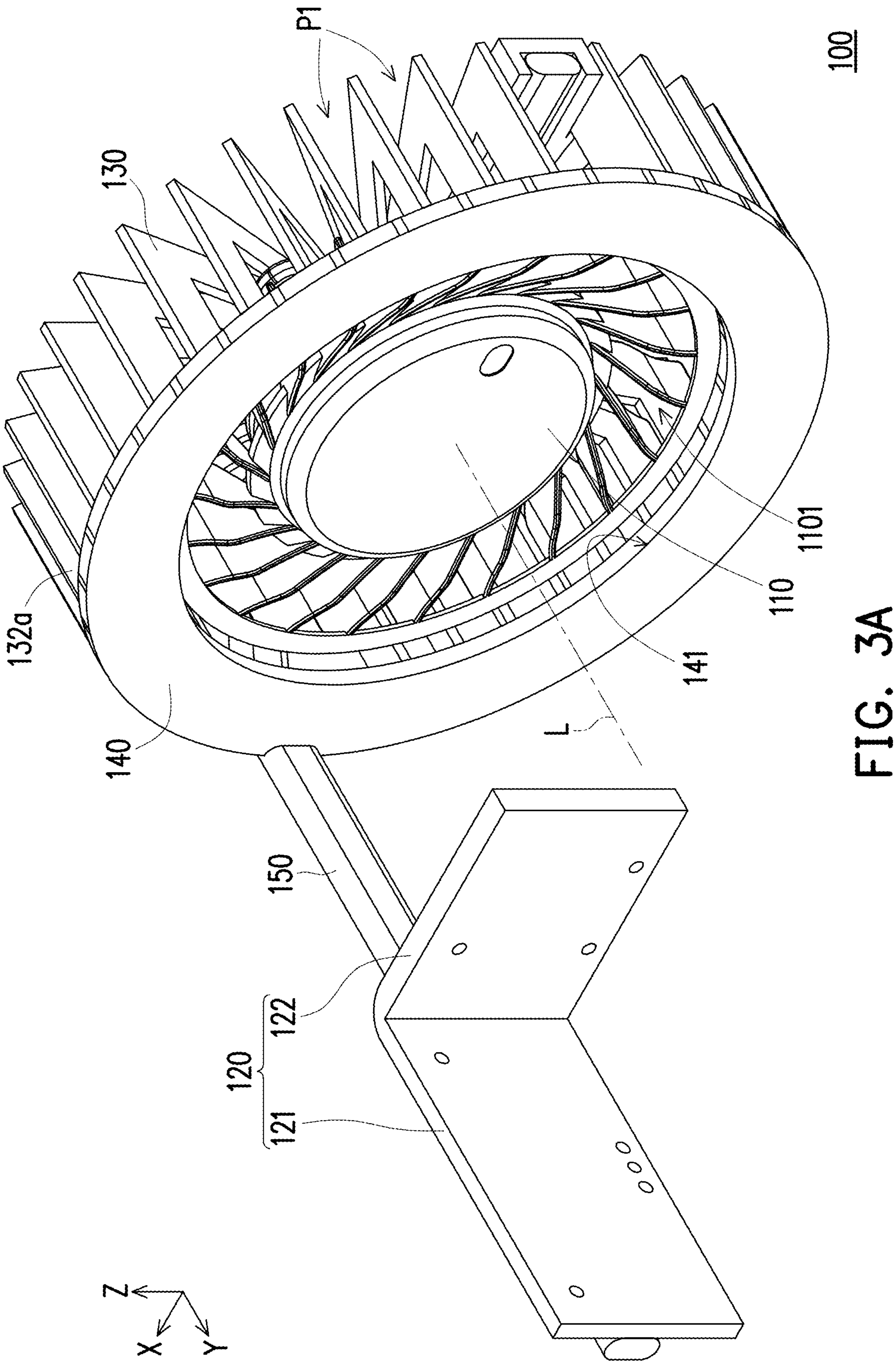
FIG. 3A is a schematic view of a heat dissipation module according to an embodiment of the disclosure.
Figure 3B:
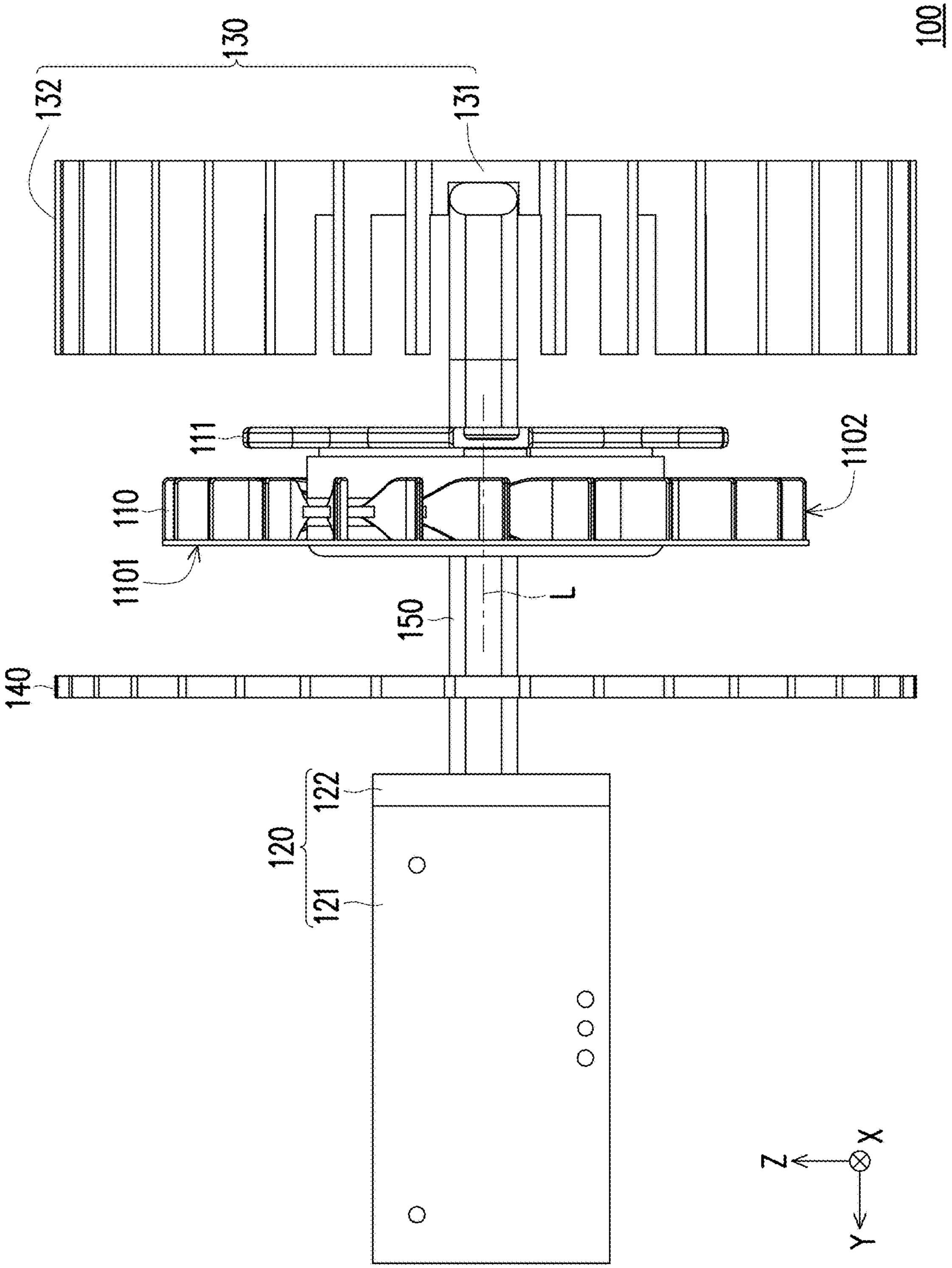
FIG. 3B is a schematic side view of the heat dissipation module of FIG. 3A in a disassembled state.
Figure 4:
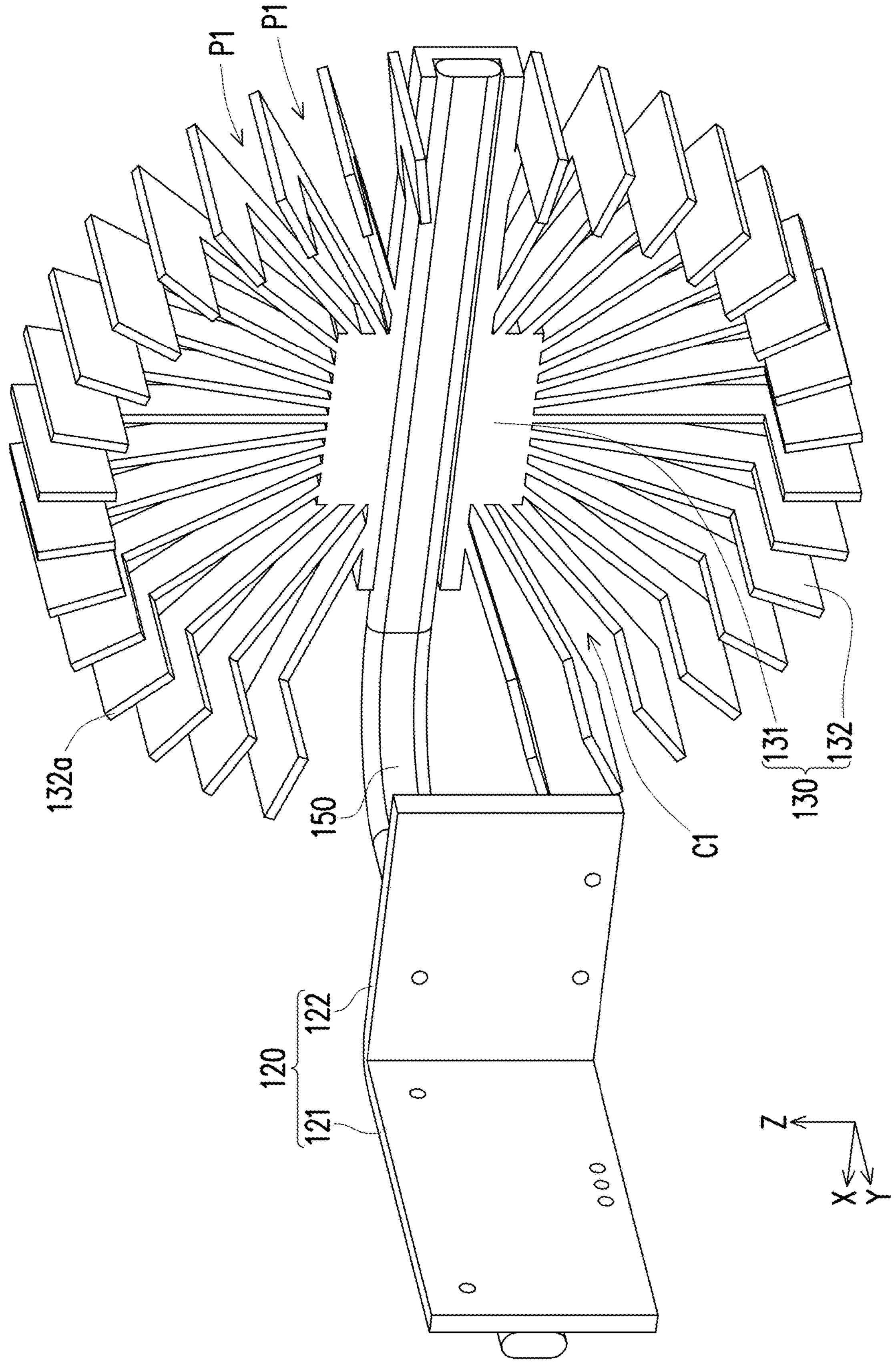
FIG. 4 and FIG. 5 are schematic perspective views of the heat dissipation module of FIG. 3A in a disassembled state with some components omitted.
Figure 5:
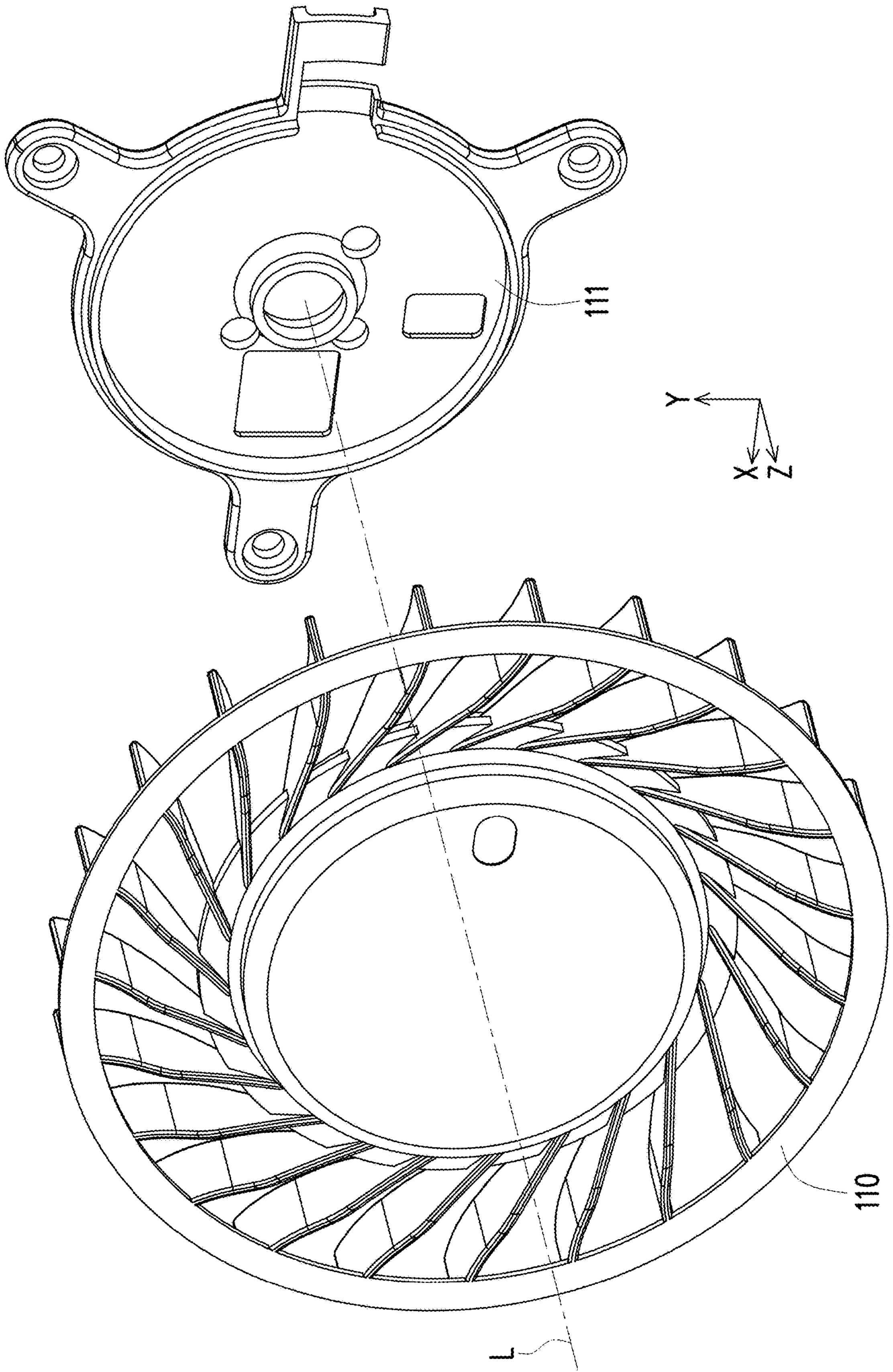
Figure 6:
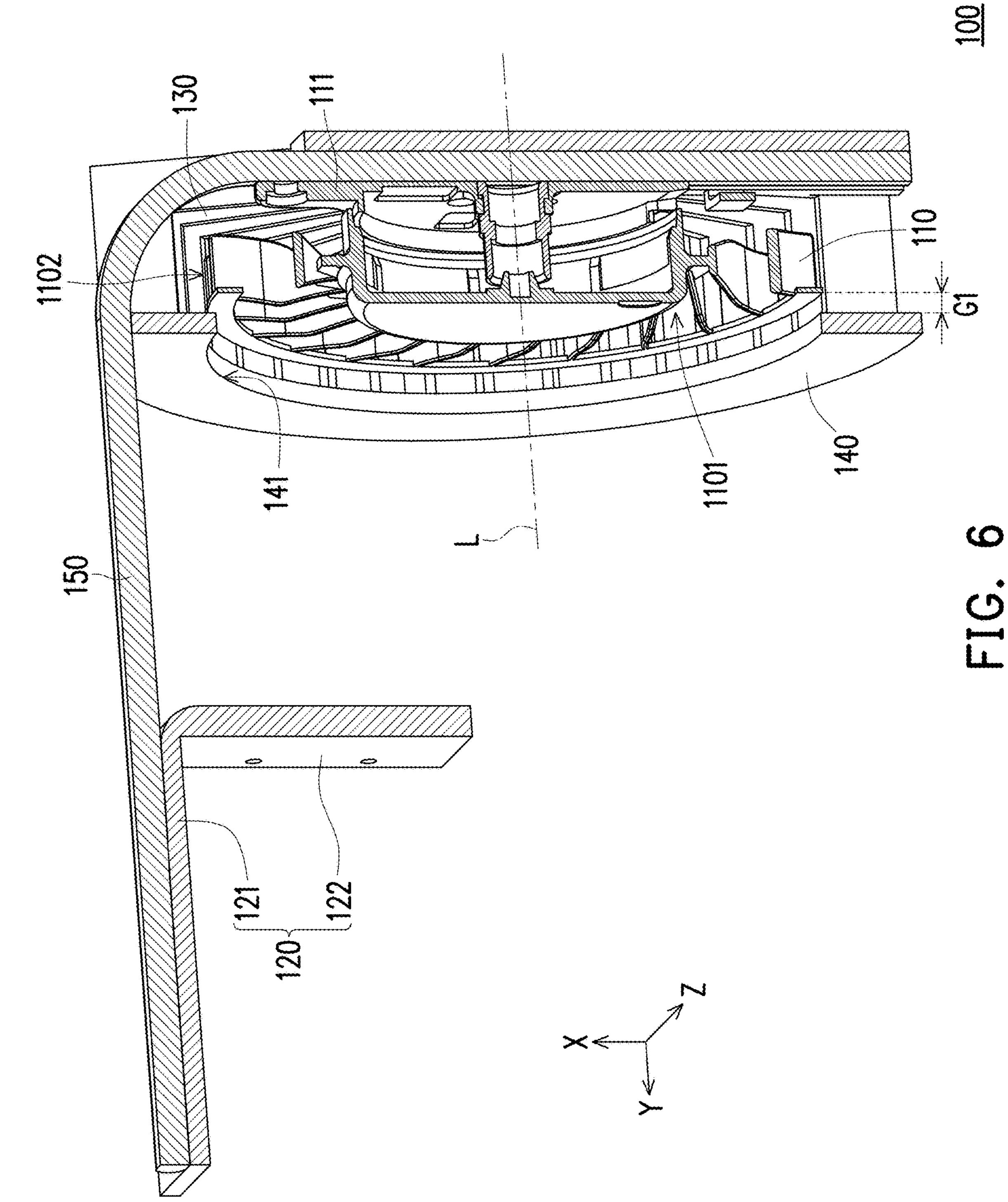
FIG. 6 is a schematic cross-sectional view of the heat dissipation module of FIG. 3A.

FIG. 3A is a schematic view of a heat dissipation module according to an embodiment of the disclosure. FIG. 3B is a schematic side view of the heat dissipation module of FIG. 3A in a disassembled state. FIG. 4 and FIG. 5 are schematic perspective views of the heat dissipation module of FIG. 3A in a disassembled state with some components omitted. FIG. 6 is a schematic cross-sectional view of the heat dissipation module of FIG. 3A. It should be noted that the X direction, the Y direction, and the Z direction are marked in FIG. 3A to FIG. 6 to show the configuration relationship between the components in the drawings. The X direction, the Y direction, and the Z direction are perpendicular to each other, but not limited thereto. Some irrelevant structures may be omitted from FIG. 3A to FIG. 6 to facilitate display and identification of the components to be explained.

Referring to FIG. 3A, in this embodiment, the heat dissipation module 100 includes an airflow generator 110, a heat dissipation substrate 120, a heat dissipation member 130, a baffle 140, and a heat conductive member 150. In this embodiment, the airflow generator 110 is, for example, a frameless blower. In this embodiment, the heat dissipation substrate 120 is a substrate made of a metal material. The baffle 140 is a plate made of a metal material. The metal material has effects of temperature equalization and heat transfer. The heat dissipation member 130 is a heat dissipation fin, but the disclosure is not limited thereto. In other embodiments, the heat dissipation substrate 120 and the baffle 140 may also be made of other materials with high thermal conductivity.

With the above configuration, the heat dissipation module 100 uses a frameless blower as the airflow generator 110 to achieve the effects of heat dissipation, which makes the system configuration more flexible, increases the fan blade size, and reduces noise.

In an embodiment, the heat dissipation module 100 of FIG. 3A is adapted for use in the projection apparatus 50 of FIG. 2A. Experiments show that the projection apparatus 50 of this embodiment is capable of reducing noise by 2 dB(A) compared with the conventional projection apparatuses and maintaining the component temperature within an appropriate range, but the disclosure is not limited thereto.

Specifically, the heat dissipation substrate 120 is configured to be connected to a heat source. In this embodiment, the heat source is, for example, the light-emitting element of the light source module 52, and the heat dissipation substrate 120 is connected to the heat source by using a thermal interface material (TIM). The thermal interface material (TIM) is, for example, thermal grease or a thermal pad, but the disclosure is not limited thereto.

Referring to FIG. 2B and FIG. 3A, in this embodiment, the heat dissipation substrate 120 is located between the projection lens 54 and the baffle 140. The heat dissipation member 130 is arranged adjacent to the second cover plate 512. The heat conductive member 150 is connected between the heat dissipation substrate 120 and the heat dissipation member 130 and configured to transfer the thermal energy of the heat source from the heat dissipation substrate 120 to the heat dissipation member 130. The heat dissipation substrate 120 is arranged close to the first cover plate 511, and the airflow generator 110 is close to the second cover plate 512 and located between the baffle 140 and the second cover plate 512.

In more detail, referring to FIG. 3A to FIG. 4, in this embodiment, the heat dissipation member 130 includes a main body 131 and a plurality of first fins 132. The first fins 132 are arranged around the outer periphery of the main body 131. Specifically, the first fins 132 extend from the main body 131 to the circumferential direction of the airflow generator 110, and the first fins 132 and the main body 131 form an accommodation space C1. The airflow generator 110 includes a rotation shaft located on the rotation axis L, and the rotation axis L is, for example, parallel to the Y-axis. The first fins 132 surround the airflow generator 110 in a radial shape with the rotation axis L as the center. Each first fin 132 has two opposite ends (not labeled). One end of each first fin 132 is connected to the main body 131, and the other end extends in a direction away from the main body 131. The other end of each first fin 132 has an extension portion 132*a* extending in a direction parallel to the rotation axis L (positive Y-axis direction), so that the first fins 132 and the main body 131 form the accommodation space C1. The airflow generator 110 is accommodated in the accommodation space C1 and connected to the main body 131. The baffle 140 is connected to the extension portion 132*a* of each first fin 132 by, for example, locking, welding, or adhesion, but the disclosure is not limited thereto. The baffle 140 is annular and has an opening 141. The opening 141 is corresponded to an air inlet surface 1101 of the airflow generator 110. In an embodiment, referring to FIG. 2A, the first fins 132 are located between the baffle 140 and the second cover plate 512.

In this embodiment, the opening 141 is circular and located on the rotation axis L. On a reference plane (for example, the X-Z plane) perpendicular to the rotation axis L, the orthographic projections of the plurality of first fins 132 on the reference plane partially overlap the orthographic projection of the airflow generator 110 on the reference plane, and the orthographic projection of the baffle 140 on the reference plane overlaps part of the orthographic projection of each first fin 132 on the reference plane. The orthographic projection of the airflow generator 110 on the reference plane does not overlap the orthographic projection of the extension portion 132*a* of each first fin 132 on the reference plane. In other words, on the reference plane perpendicular to the rotation axis L, at least a part of the orthographic projection of each of the first fins 132 does not overlap the orthographic projection of the airflow generator 110 (for example, the extension portion 132*a*).

Specifically, in this embodiment, each of the plurality of first fins 132 is arranged perpendicular to the rotation axis L, and the plurality of first fins 132 are spaced apart from each other along the circumferential direction of the main body 131 to form a plurality of airflow channels P1. There is one airflow channel P1 between any two adjacent first fins 132. In this embodiment, the airflow generated by the airflow generator 110 enters the air inlet surface 1101 of the airflow generator 110 from the opening 141 of the baffle 140, and then enters the plurality of airflow channels P1 of the heat dissipation member 130 from the airflow generator 110. The angle between an inlet direction I1 (refer to FIG. 2B) of the airflow on the air inlet surface of the airflow generator 110 and an outlet direction 12 (refer to FIG. 2B) from the airflow channels P1 is approximately 90°, but the disclosure is not limited thereto.

Referring to FIG. 5, in this embodiment, the airflow generator 110 includes a back plate 111 and a fan blade portion (not labeled). The back plate 111 is located on the rotation axis L and connected to the main body 131, so that the airflow generator 110 is fixed to the heat dissipation member 130. Furthermore, the back plate 111 is located on the side of the airflow generator 110 away from the air inlet surface 1101. That is to say, the airflow generated by the airflow generator 110 does not reach the back plate 111 before passing through the fan blades of the fan blade portion from the air inlet surface 1101.

Referring to FIG. 6, in this embodiment, a gap G1 is defined between the baffle 140 and the fan blade portion of the airflow generator 110 in a direction parallel to the rotation axis L (for example, the positive Y-axis direction or negative Y-axis direction). For example, the gap G1 is less than 0.3 mm to prevent the airflow from flowing out of an air outlet 1102 of the airflow generator 110 and then flowing back. In an embodiment, the baffle 140 is very close to the airflow generator 110 but not in contact with the airflow generator 110 so as to prevent the fan blades of the fan blade portion of the airflow generator 110 from interference with the baffle 140 during rotation.

Referring to FIG. 2B, in this embodiment, the second openings H2 (air outlet A2) of the cylindrical portion 513 correspond to the plurality of airflow channels P1. Specifically, the ambient air outside the housing 51 flows into the housing 51 through the first openings H1 (air inlet A1), enters the air inlet surface 1101 of the airflow generator 110 from the opening 141 of the baffle 140, then enters the plurality of airflow channels P1 of the heat dissipation member 130 from the airflow generator 110, and flows out of the housing 51 from the air outlet A2.

In this embodiment, the heat dissipation substrate 120 includes a first plate body 121 and a second plate body 122 that are connected. An included angle α is defined between the first plate body 121 and the second plate body 122, and the included angle α is 90°, but the disclosure is not limited thereto. In this embodiment, on the reference plane (for example, the X-Z plane) perpendicular to the rotation axis L, the orthographic projection of the heat source (for example, the light-emitting elements E1, E2, and E3 of the light source module 52) arranged on the heat dissipation substrate 120 overlaps the orthographic projection of the airflow generator 110. That is to say, the heat source arranged on the heat dissipation substrate 120 is actually located on the path of the airflow that enters the housing 51 from the air inlet A1 to the airflow generator 110 of the heat dissipation module 100, which allows the airflow to dissipate part of the heat.

Figure 7:
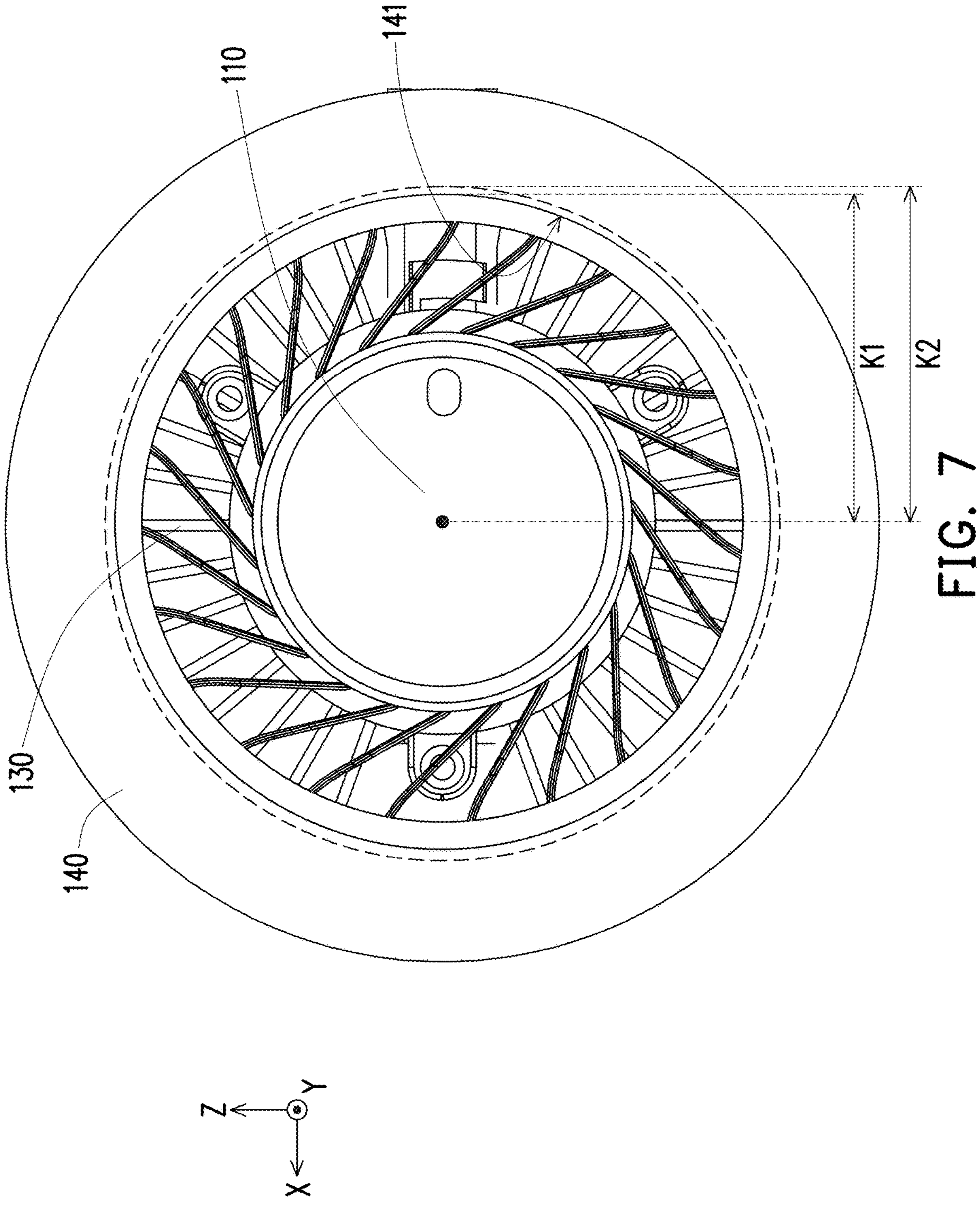
FIG. 7 is a schematic front view of the heat dissipation module of FIG. 3A with some components omitted.

FIG. 7 is a schematic front view of the heat dissipation module of FIG. 3A with some components omitted. It should be noted that the X direction, the Y direction, and the Z direction are marked in FIG. 7 to show the configuration relationship between the components in the drawing. The X direction, the Y direction, and the Z direction are perpendicular to each other, but not limited thereto. Referring to FIG. 7, in this embodiment, on the reference plane (for example, the X-Z plane) perpendicular to the rotation axis L, the orthographic projection of the opening 141 overlaps and is smaller than the orthographic projection of the airflow generator 110. In other words, a radius K1 of the opening 141 is smaller than a radius K2 of the airflow generator 110, but the disclosure is not limited thereto.

Other embodiments will be described below as examples. It should be noted that the following embodiments are described with reference to the reference numerals and part of the content of the foregoing embodiments, wherein the same reference numerals are used to represent the same or similar components, and description of the same technical content will be omitted. Please refer to the foregoing embodiments for description of the omitted content, which will not be repeated in the following embodiments.

Figure 8A:
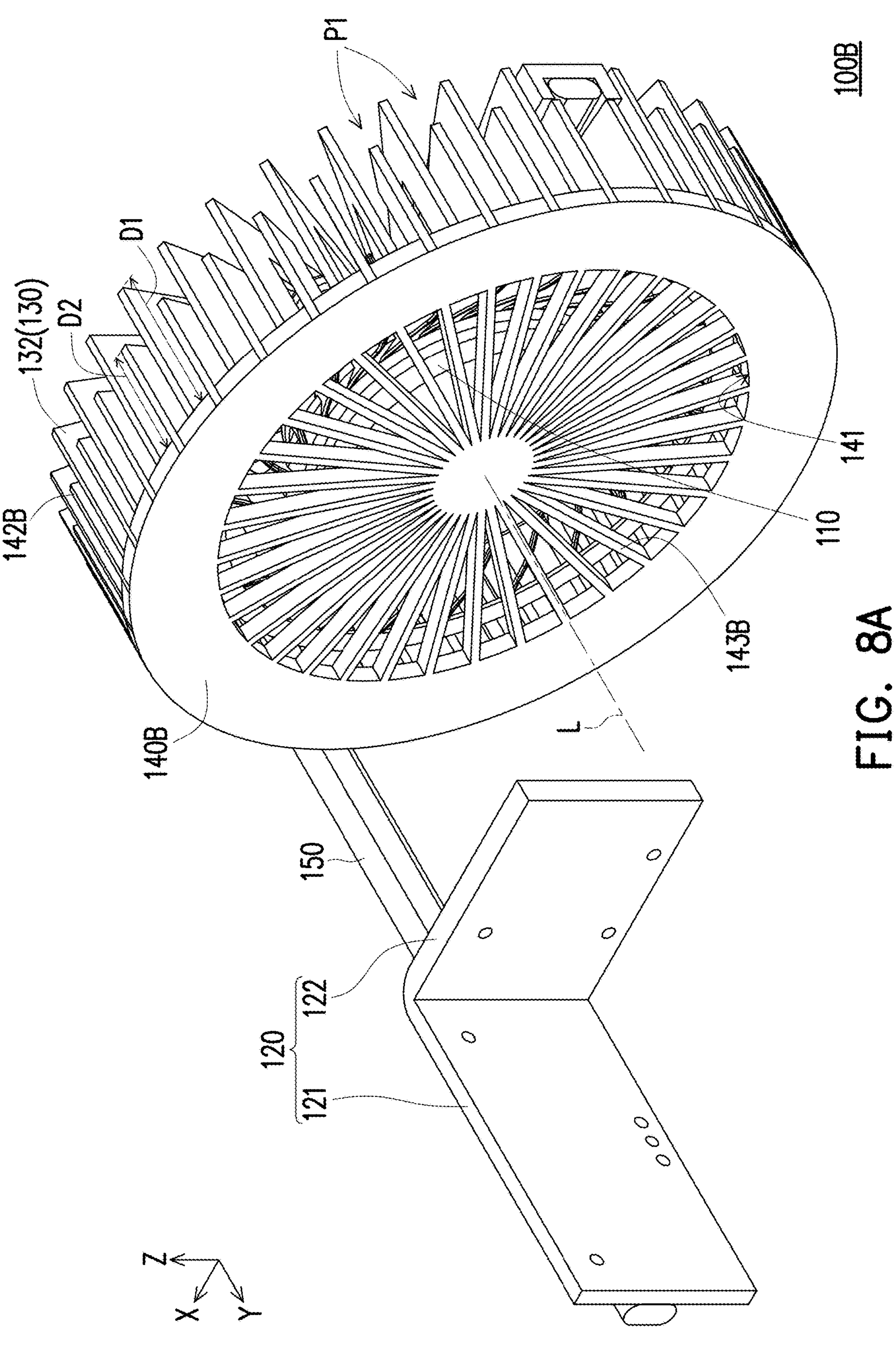
FIG. 8A is a schematic view of a heat dissipation module according to another embodiment of the disclosure.
Figure 8B:
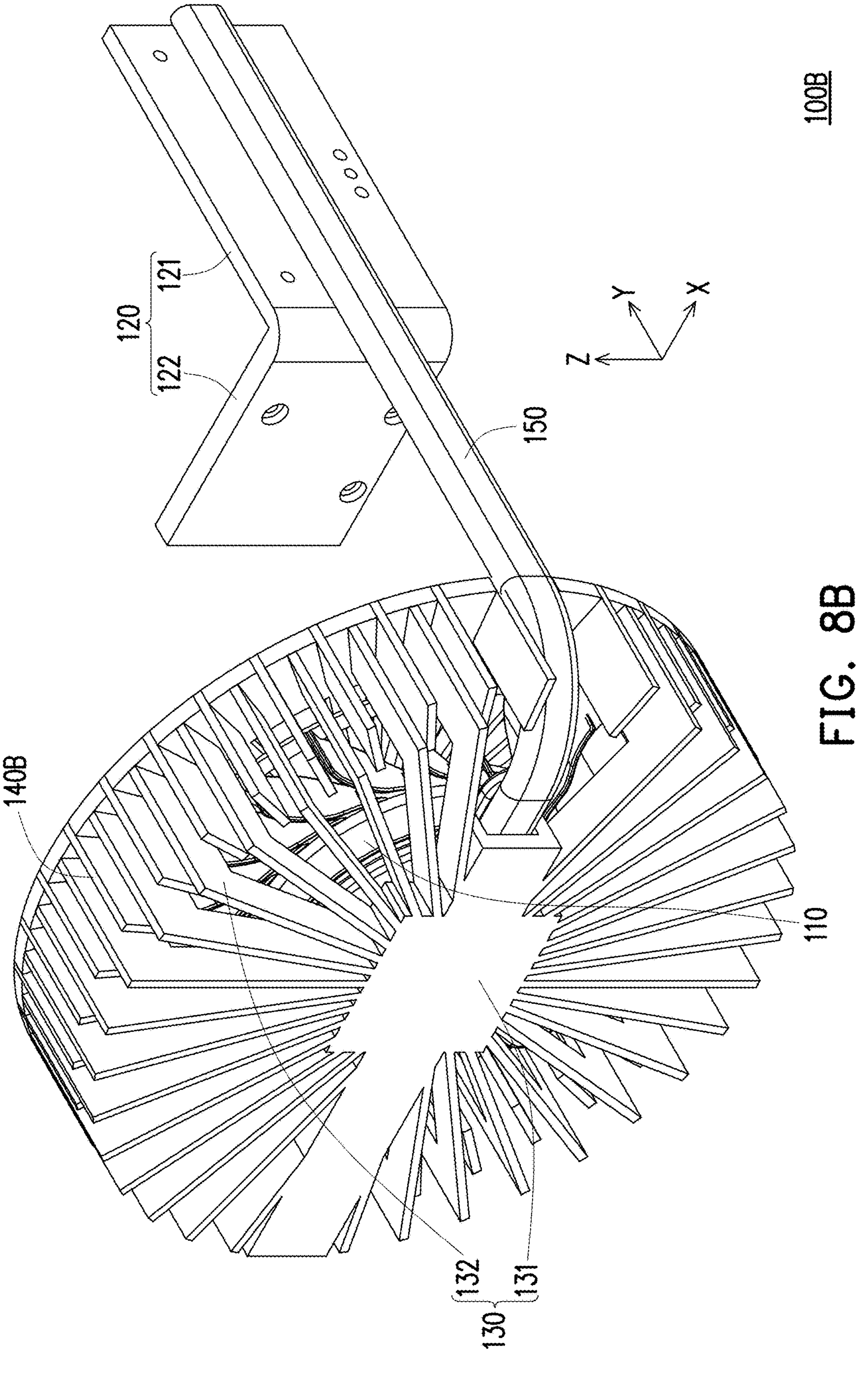
FIG. 8B is a schematic view of the heat dissipation module of FIG. 8A from another perspective.

FIG. 8A is a schematic view of a heat dissipation module according to another embodiment of the disclosure. FIG. 8B is a schematic view of the heat dissipation module of FIG. 8A from another perspective. Referring to FIG. 8A and FIG. 8B, in this embodiment, the heat dissipation module 100B is slightly different from the heat dissipation module 100 of FIG. 3A, and the main differences lie in that the baffle 140B includes a plurality of second fins 142B, which are spaced apart from each other and respectively corresponded to the plurality of airflow channels P1.

Thus, the second fins 142B of the baffle 140B are staggered with the first fins 132 of the heat dissipation member 130, so as to increase the density of the fins and increase the heat dissipation area. This design improves the difference between the gap between adjacent first fins near the center and the gap far from the center.

In this embodiment, the second fin 142B extends from the baffle 140B toward the main body 131 of the heat dissipation member 130 along an extending direction (negative Y-axis direction), and the extending direction is parallel to the rotation axis L. In the extending direction, a length D2 of the second fin 142B of the baffle 140B is smaller than a length D1 of the first fin 132 of the heat dissipation member 130. The second fins 142B are arranged at intervals, for example, in a manner perpendicular to the rotation axis L. Thus, the design of the second fins 142B increases the heat dissipation area.

Figure 9A:
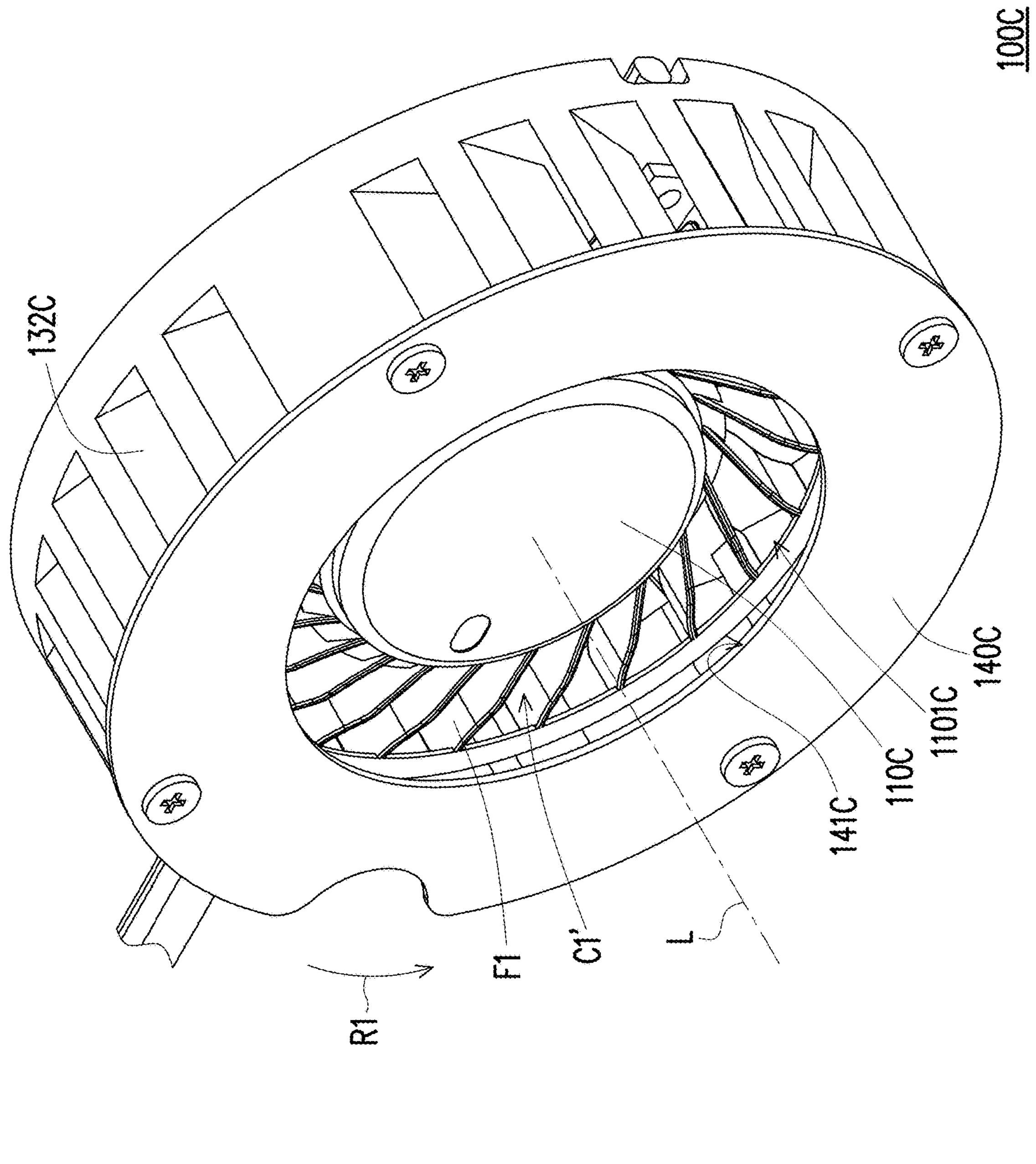
FIG. 9A is a schematic view of a heat dissipation module according to another embodiment of the disclosure.
Figure 9B:
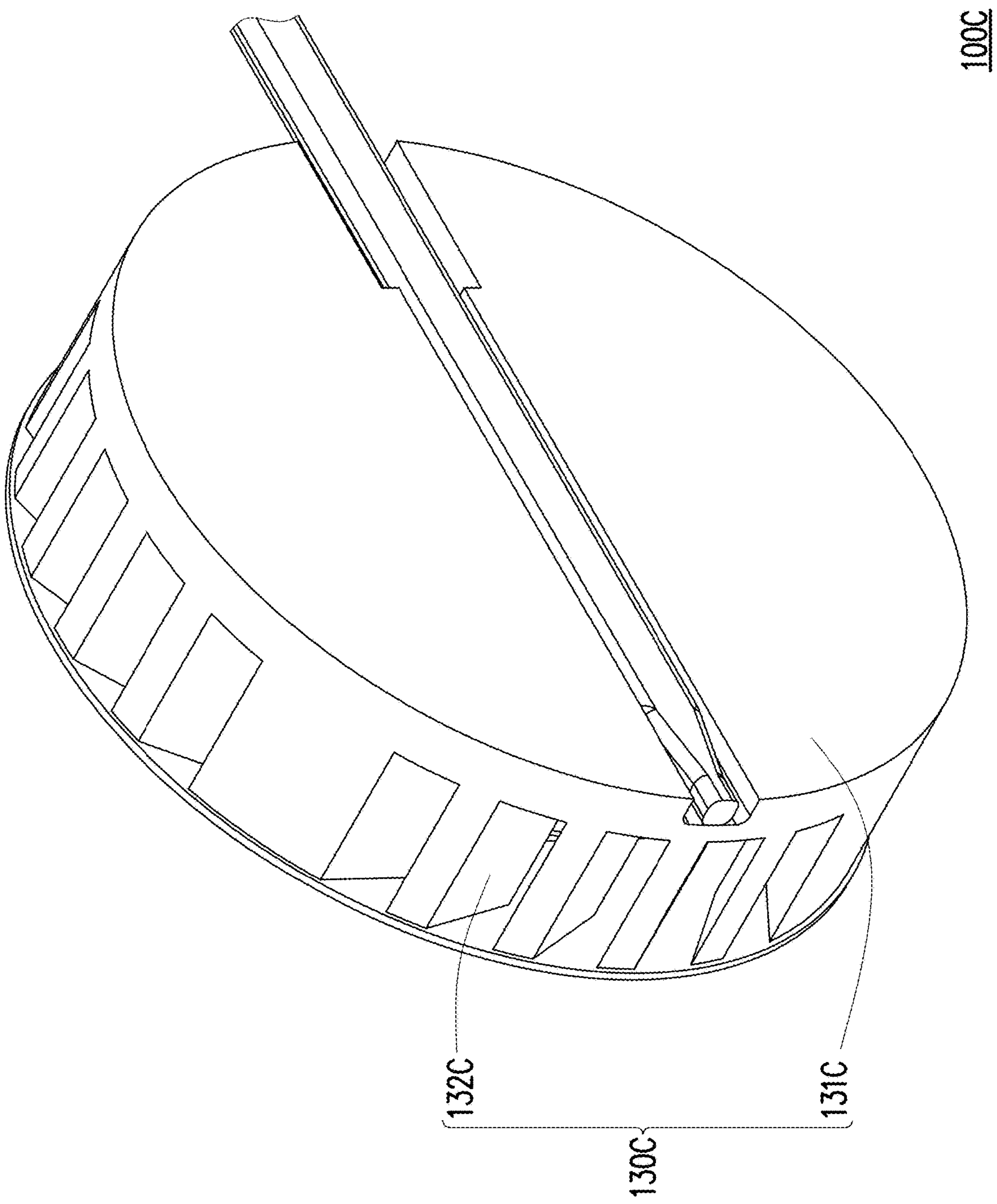
FIG. 9B is a schematic view of the heat dissipation module of FIG. 9A from another perspective.
Figure 9C:
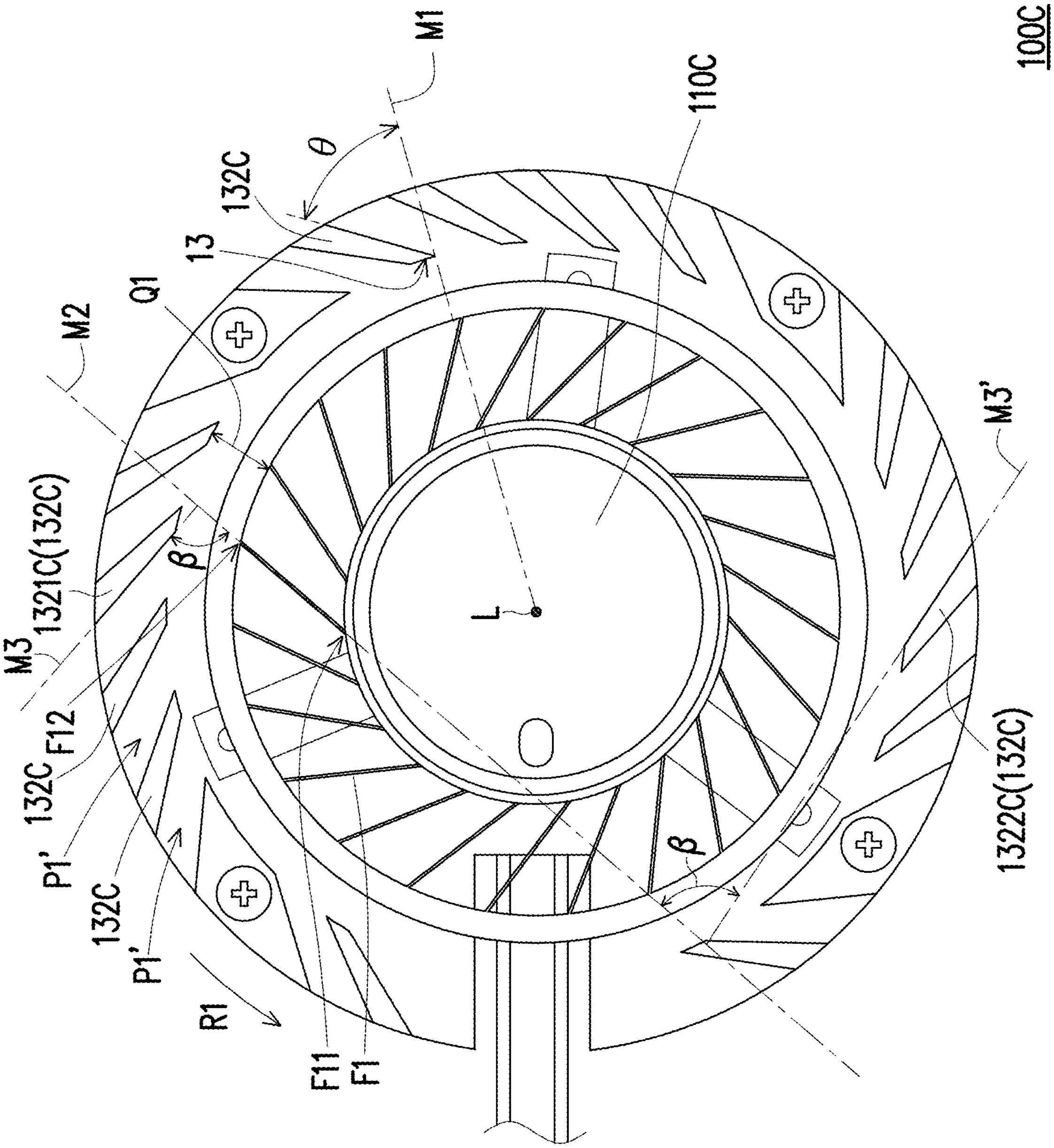
FIG. 9C is a front view of the heat dissipation module of FIG. 9A.

FIG. 9A is a schematic view of a heat dissipation module according to another embodiment of the disclosure. FIG. 9B is a schematic view of the heat dissipation module of FIG. 9A from another perspective. FIG. 9C is a front view of the heat dissipation module of FIG. 9A. Referring to FIG. 9A to FIG. 9C, in this embodiment, a fan blade portion of an airflow generator 110C of a heat dissipation module 100C includes a plurality of fan blades F1. The plurality of fan blades F1 are arranged around a rotation axis L. The fan blade portion is configured to rotate in a rotation direction R1 with the rotation axis L as the center, and each of the plurality of fan blades F1 is inclined in a direction opposite to the rotation direction R1. That is to say, the plurality of fan blades F1 of the airflow generator 110C are backward-inclined fan blades, but are not limited thereto.

In this embodiment, on a reference plane perpendicular to the rotation axis L, the orthographic projection of the airflow generator 110C is completely located within the orthographic projection of a main body 131C. In other words, the orthographic projection of the airflow generator 110C does not overlap the orthographic projections of a plurality of first fins 132C.

Referring to FIG. 9C, in this embodiment, the plurality of first fins 132C are arranged around the airflow generator 110C, and an extending direction of each of the plurality of first fins 132C from a point close to the rotation axis L toward a point away from the rotation axis L does not pass through the rotation axis L. This design is advantageous in effectively reducing the flow resistance of the active airflow generator 110C, reducing the pressure at the tip of the first fin 132C, suppressing high-frequency whistle noise and overall noise, and increasing the flow rate of the airflow.

In this embodiment, the plurality of first fins 132C are spaced apart from each other along the circumferential direction of the main body 131C to form a plurality of airflow channels P1'. There is one airflow channel P1' between any two adjacent first fins 132C. The airflow generated by the airflow generator 110C may flow out through the plurality of airflow channels P1'.

In this embodiment, each of the plurality of first fins 132C has an end 13 close to the rotation axis L. A reference extension line M1 passes through the end 13 and the rotation axis L. The reference extension line M1 forms an included angle θ with the first fin 132C corresponding to the end 13. The included angle θ is greater than 0° and less than 90°. In other words, the plurality of first fins 132C of FIG. 9C are not radial structures formed with the rotation axis L as the center.

In this embodiment, each of the plurality of fan blades F1 has a fan blade orthographic projection on the reference plane perpendicular to the rotation axis L. The fan blade orthographic projection has a first end F11 close to the rotation axis L and a second end F12 away from the rotation axis L. The first end F11 and the second end F12 of the fan blade orthographic projection are connected in a straight line. An extension line M2 of the straight line of the fan blade orthographic projection forms an included angle β with two extension lines M3 and M3' of two orthographic projections of at least two of the plurality of first fins 132C on the reference plane. The included angle β is from 80 to 100. The at least two of the plurality of first fins 132C are, for example, first fins 1321C and 1322C, but are not limited thereto. It should be noted that the outer shape of the fan blade F1 may be a flat plate shape or a non-flat plate shape, and the non-flat plate shape includes, for example, a curved surface. This design is advantageous in that the adjacent first fins 132C have a larger gap between each other, which effectively reduces the flow resistance of the active airflow generator 110C to improve performance, reduces turbulence and noise, and reduces the impedance of the heat dissipation member 130C to increase the flow rate generated by the active heat dissipation module 100C.

In this embodiment, there is a gap Q1 between one end F12 of each of the plurality of fan blades F1 away from the rotation axis L and each of the adjacent plurality of heat dissipation fins 132C. The gap Q1 is greater than or equal to 5 mm, to maintain low noise performance, but is not limited thereto. The gap Q1 may need to be greater than or equal to 10 mm in the previous design of plurality of heat dissipation fins 132C in a non-radial structure to maintain low noise performance. This design is advantageous in that, when the included angle θ is close to 90°, the wind flow generated by the fan blades F1 is radial, which is almost parallel to the airflow channel P1' between the first fins 132C, allowing the wind flow to pass through the first fins 132C more smoothly to reduce turbulence and noise, and reducing the impedance of the heat dissipation device to increase the flow rate generated by the active heat dissipation module, and the gap between the fan blade F1 and the first fin 132C can be reduced to achieve better space utilization.

Figure 10:
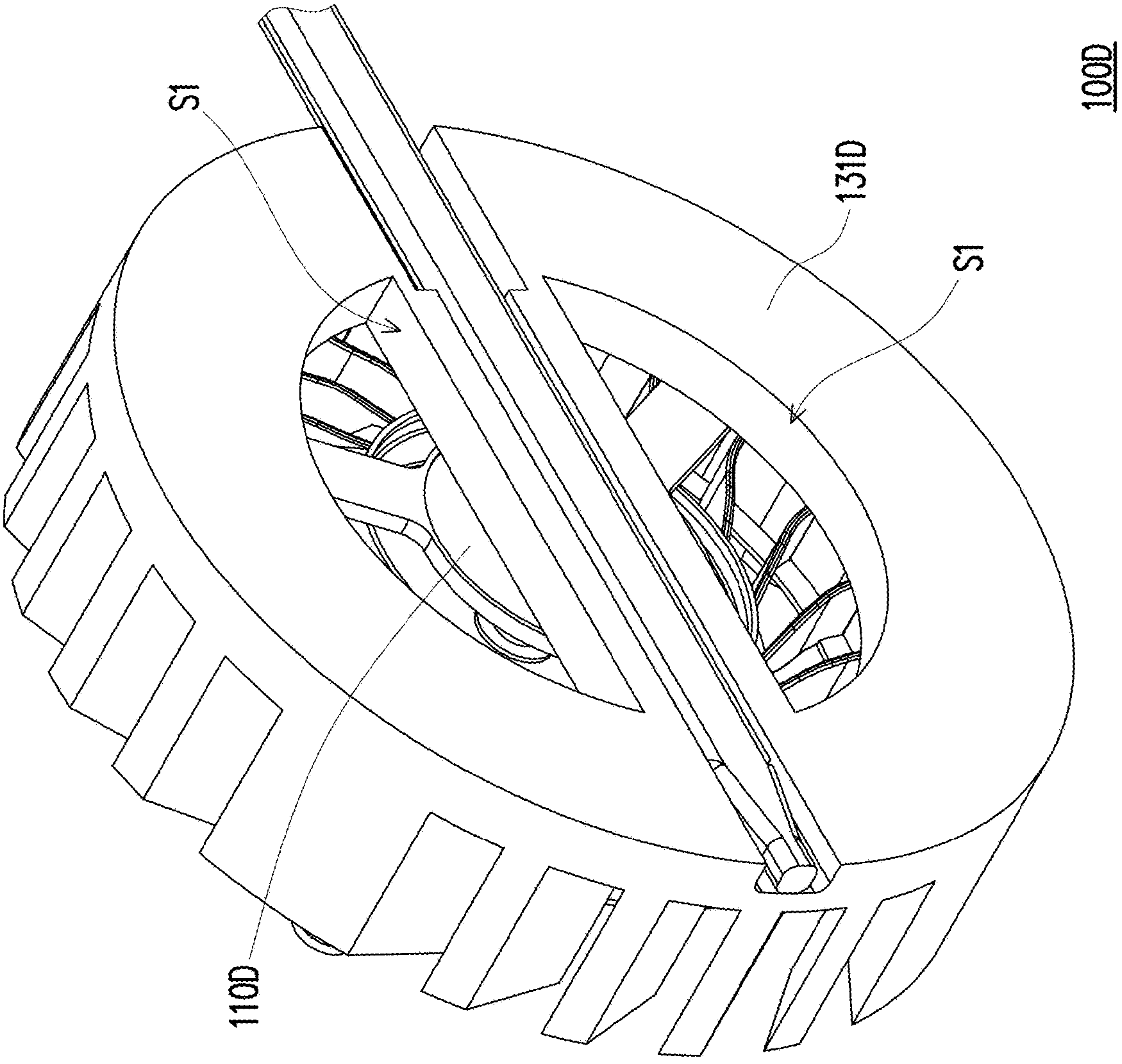
FIG. 10 is a schematic view of a heat dissipation module according to another embodiment of the disclosure.

FIG. 10 is a schematic view of a heat dissipation module according to another embodiment of the disclosure. Referring to FIG. 10, a heat dissipation module 100D of this embodiment is slightly different from the heat dissipation module 100C of FIG. 9A. The main difference lies in that a main body 131D has two through holes S1 which are corresponded to the air inlet surface of an airflow generator 110D. Details of the air inlet surface may be understood by referring to the air inlet surface 1101C of FIG. 9A. The area of the two through holes S1 is smaller than the area of the opening of the baffle. Details of the opening of the baffle may be understood by referring to the opening 141C of the baffle 140C of FIG. 9A. The two through holes S1 can serve as air inlets to improve the heat dissipation effect.

Figure 11:
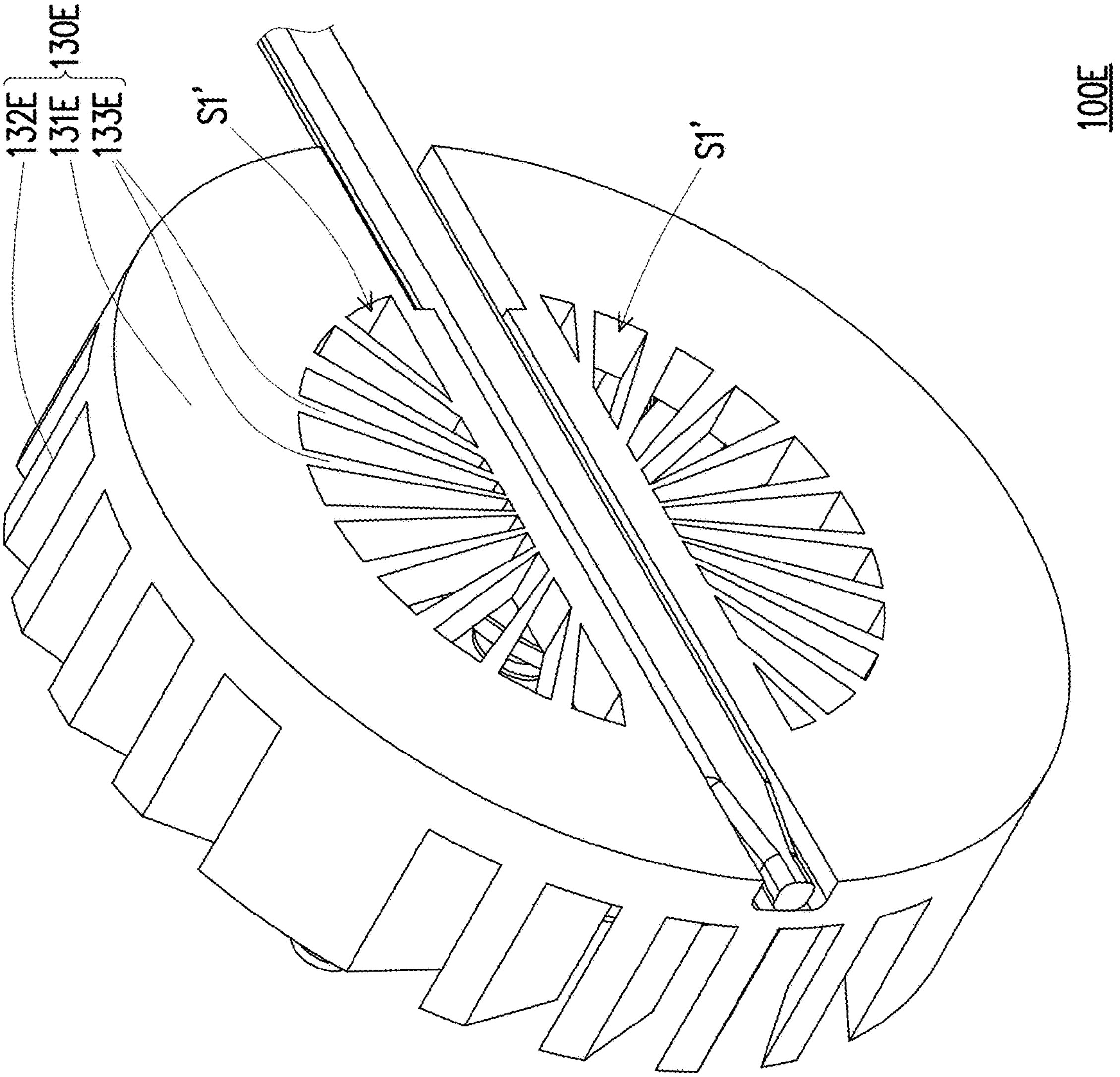
FIG. 11 is a schematic view of a heat dissipation module according to another embodiment of the disclosure.

FIG. 11 is a schematic view of a heat dissipation module according to another embodiment of the disclosure. Referring to FIG. 11, a heat dissipation module 100E of this embodiment is slightly different from the heat dissipation module 100D of FIG. 10. The main difference lies in that a heat dissipation member 130E includes a plurality of third fins 133E. The plurality of third fins 133E are disposed in two through holes S1'. Both ends of each third fin 133E are connected to a main body 131E. The first fins 132E, the third fins 133E, and the main body 131E form a space similar to the accommodation space C1 of FIG. 4 to accommodate the airflow generator 110D.

To sum up, the embodiments of the disclosure have at least one of the following advantages or effects. In the projection apparatus according to the disclosure, the heat dissipation module is adapted for dissipating heat from the heat source. For example, the ambient air outside the housing of the projection apparatus is allowed to flow into the housing through the air inlet, enter the air inlet surface of the airflow generator from the opening of the baffle, then enter the airflow channels of the heat dissipation member from the airflow generator, and flow out of the housing from the air outlet, thereby achieving favorable heat dissipation effects. In addition, the heat dissipation module uses a frameless airflow generator to achieve heat dissipation effects, which makes the system configuration more flexible, increases the fan blade size, and reduces noise. Furthermore, the baffle is very close to the airflow generator so as to prevent the airflow from flowing out of the air outlet of the airflow generator and then flowing back.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A heat dissipation module adapted for dissipating heat from a heat source, the heat dissipation module comprising:

an airflow generator;

a heat dissipation substrate connected to the heat source;

a heat dissipation member;

a baffle; and a heat conductive member connected between the heat dissipation substrate and the heat dissipation member configured to transfer thermal energy of the heat source from the heat dissipation substrate to the heat dissipation member, wherein the heat dissipation member comprises a main body and a plurality of first fins, the plurality of first fins are arranged around an outer periphery of the main body, and the plurality of first fins and the main body form an accommodation space, the airflow generator has a rotation axis, and is accommodated in the accommodation space and connected to the main body, the baffle is connected to the plurality of first fins and has an opening corresponded to an air inlet surface of the airflow generator, and the opening is located on the rotation axis, and on a reference plane perpendicular to the rotation axis, at least a part of an orthographic projection of each of the plurality of first fins does not overlap an orthographic projection of the airflow generator, and an orthographic projection of the baffle overlaps the plurality of orthographic projections of the plurality of first fins.

2. The heat dissipation module according to claim 1, wherein on the reference plane perpendicular to the rotation axis, an orthographic projection of the opening overlaps and is smaller than the orthographic projection of the airflow generator.

3. The heat dissipation module according to claim 1, wherein each of the plurality of first fins is arranged perpendicular to the rotation axis, the plurality of first fins are spaced apart from each other along a circumferential direction of the main body to form a plurality of airflow channels, and one of the plurality of airflow channels is arranged between any adjacent two of the plurality of first fins.

4. The heat dissipation module according to claim 3, wherein the baffle comprises a plurality of second fins, and the plurality of second fins are spaced apart from each other and respectively corresponded to the plurality of airflow channels.

5. The heat dissipation module according to claim 4, wherein each of the plurality of second fins extends from the baffle toward the main body of the heat dissipation member along an extending direction, and the extending direction is parallel to the rotation axis, wherein in the extending direction, a length of each of the plurality of second fins is smaller than a length of each of the plurality of first fins.

6. The heat dissipation module according to claim 3, wherein airflow generated by the airflow generator enters the air inlet surface of the airflow generator from the opening of the baffle, and then enters the plurality of airflow channels of the heat dissipation member from the airflow generator.

7. The heat dissipation module according to claim 1, wherein a gap is defined between the baffle and a fan blade portion of the airflow generator on the rotation axis.

8. The heat dissipation module according to claim 7, wherein the gap is less than 0.3 mm.

9. The heat dissipation module according to claim 1, wherein the airflow generator comprises a back plate, and the back plate is located on the rotation axis and connected to the main body.

10. The heat dissipation module according to claim 1, wherein the airflow generator is a frameless blower.

11. The heat dissipation module according to claim 1, wherein on the reference plane perpendicular to the rotation axis, an orthographic projection of the heat source arranged on the heat dissipation substrate overlaps the orthographic projection of the airflow generator.

12. The heat dissipation module according to claim 1, wherein a fan blade portion of the airflow generator comprises a plurality of fan blades, the plurality of fan blades are arranged around the rotation axis, the fan blade portion is configured to rotate in a rotation direction with the rotation axis as a center, and each of the plurality of fan blades is inclined in a direction opposite to the rotation direction.

13. The heat dissipation module according to claim 12, wherein the plurality of first fins are arranged around the airflow generator, and an extending direction of each of the plurality of first fins from a point close to the rotation axis toward a point away from the rotation axis does not pass through the rotation axis.

14. The heat dissipation module according to claim 13, wherein the plurality of first fins are spaced apart from each other along a circumferential direction of the main body to form a plurality of airflow channels, and one of the plurality of airflow channels is arranged between any adjacent two of the plurality of first fins.

15. The heat dissipation module according to claim 12, wherein each of the plurality of first fins has an end close to the rotation axis, a reference extension line passes through the end and the rotation axis, and the reference extension line forms an included angle that is greater than 0° and less than 90° with the first fin corresponding to the end.

16. The heat dissipation module according to claim 12, wherein each of the plurality of fan blades has a fan blade orthographic projection on the reference plane perpendicular to the rotation axis, the fan blade orthographic projection has a first end close to the rotation axis and a second end away from the rotation axis, the first end and the second end of the fan blade orthographic projection are connected in a straight line, and an extension line of the straight line of the fan blade orthographic projection only forms an included angle that is from 80 to 100 with two extension lines of two orthographic projections of two of the plurality of first fins on the reference plane.

17. The heat dissipation module according to claim 12, wherein a gap is formed between one end of each of the plurality of fan blades away from the rotation axis and each of the adjacent plurality of heat dissipation fins, and the gap is greater than or equal to 5 mm.

18. The heat dissipation module according to claim 1, wherein on the reference plane perpendicular to the rotation axis, the orthographic projection of the airflow generator is completely located within an orthographic projection of the main body.

19. The heat dissipation module according to claim 18, wherein the main body has two through holes which are corresponded to the air inlet surface of the airflow generator, and an area of the two through holes is smaller than an area of the opening.

20. The heat dissipation module according to claim 19, wherein the heat dissipation member comprises a plurality of third fins, the plurality of third fins are disposed in the two through holes, and the plurality of first fins, the plurality of third fins, and the main body form the accommodation space.

21. A projection apparatus, comprising:

a housing;

a light source module;

an optomechanical module;

a projection lens; and the heat dissipation module according to claim 1, wherein the heat dissipation module, the light source module, the optomechanical module, and the projection lens are arranged in the housing, the housing comprises a first cover plate, a second cover plate opposite to the first cover plate, and a cylindrical portion connected between the first cover plate and the second cover plate, and the cylindrical portion comprises an air inlet adjacent to the first cover plate and an air outlet adjacent to the second cover plate, the light source module is configured to provide an illumination beam, the optomechanical module is arranged on a transmission path of the illumination beam, and the optomechanical module comprises a light valve configured to convert the illumination beam into an image beam, and the projection lens is located on a transmission path of the image beam from the light valve and configured to project the image beam out of the projection apparatus.

22. The projection apparatus according to claim 21, wherein the heat dissipation substrate is configured to be connected to the light source module, and the heat dissipation substrate is located between the projection lens and the baffle.

23. The projection apparatus according to claim 21, wherein the heat dissipation substrate is close to the first cover plate, the airflow generator is close to the second cover plate, and ambient air outside the housing flows into the housing through the air inlet, enters the air inlet surface of the airflow generator from the opening of the baffle, then enters the plurality of airflow channels of the heat dissipation member from the airflow generator, and flows out of the housing from the air outlet.

24. The projection apparatus according to claim 21, wherein the first cover plate is provided with a light outlet, and the image beam is projected outside the projection apparatus from the light outlet of the first cover plate.

25. The projection apparatus according to claim 21, wherein the air inlet comprises a plurality of first openings surrounding the first cover plate, the air outlet comprises a plurality of second openings surrounding the second cover plate, and the plurality of second openings correspond to the plurality of airflow channels.

26. The projection apparatus according to claim 21, wherein the heat dissipation member is arranged adjacent to the second cover plate, and the plurality of first fins are located between the baffle and the second cover plate.

27. The projection apparatus according to claim 21, wherein on the reference plane perpendicular to the rotation axis, an orthographic projection of the opening overlaps and is smaller than the orthographic projection of the airflow generator.

28. The projection apparatus according to claim 21, wherein a fan blade portion of the airflow generator comprises a plurality of fan blades, the plurality of fan blades are arranged around the rotation axis, the fan blade portion is configured to rotate in a rotation direction with the rotation axis as a center, and each of the plurality of fan blades is inclined in a direction opposite to the rotation direction.

* * * * *